United States Patent [19]

Ive et al.

[11] 4,442,520

[45] Apr. 10, 1984

[54] SIGNAL ERROR DETECTING

[76] Inventors: John G. S. Ive; Alan C. Thirlwall, both c/o Sony Broadcast Limited, City Wall House, Basing View, Basingstoke, Hampshire, England

[21] Appl. No.: 317,295

[22] Filed: Nov. 2, 1981

[30] Foreign Application Priority Data

Nov. 18, 1980 [GB] United Kingdom ............... 8036934

[51] Int. Cl.³ ............................................. G06F 11/08
[52] U.S. Cl. ..................................... 371/55; 360/34.1; 371/57
[58] Field of Search ............................ 371/55, 56, 57; 360/34.1, 35.1

[56] References Cited

U.S. PATENT DOCUMENTS

| 3,405,235 | 10/1968 | Carter | 371/55 |
| 3,573,729 | 4/1971 | Gunn et al. | 371/56 |
| 3,610,819 | 10/1971 | Thompson | 360/34.1 |
| 3,783,383 | 1/1974 | Forster et al. | 371/56 |
| 3,886,522 | 5/1975 | Barton et al. | 371/57 |
| 4,070,646 | 1/1978 | Sandlin | 371/56 |
| 4,244,052 | 1/1981 | Hemsworth | 371/56 |
| 4,309,694 | 1/1982 | Henry | 371/55 |

Primary Examiner—Charles E. Atkinson
Attorney, Agent, or Firm—Lewis H. Eslinger; Alvin Sinderbrand

[57] ABSTRACT

Apparatus for example for use in achieving correct field framing on reproduction of a digital PAL television signal from a video tape recorder, by correcting errors in an input square-wave signal which signal alternates between first and second levels every four fields of the television signal, the apparatus comprising first and second similar counters to be supplied with the input signal so as to be enabled to count when the input signal is of the first and said second level respectively, means to detect errors in the input signal and thereupon to supply a signal to disable both the first and second counters, a clock pulse source for supplying a clock pulse signal of high frequency relative to the frequency of the input signal to the first and second counter, and a bistable circuit arranged to be triggered to a first stable condition by an overflow signal from the first counter and to a second stable condition by an overflow signal from the second counter, whereby the bistable circuit supplies a corrected replica of the input signal.

14 Claims, 5 Drawing Figures

SIGNAL ERROR DETECTING

BACKGROUND OF THE DISCLOSURE

1. Field of the Invention

This invention relates to signal error detecting. More particularly, but not exclusively, the invention relates to apparatus for achieving correct field framing on reproduction of a digital PAL television signal from a video tape recorder (VTR).

2. Description of the Prior Art

The color sub-carrier frequency used in a 625 line PAL television system is 4.43361875 MHz, and the use of this frequency results in a whole number of cycles of the sub-carrier frequency in every sequence of eight successive fields. When a television signal is converted to digital form, for example for recording, it is usual to code only the actual video information, and to omit the synchronizing signals and the color burst signals. When reproducing a composite coded video signal, or in some cases as decoded video signal, it is necessary to know the original eight field sequence when adding back the synchronizing signals and the color burst signals. Thus if the coded video signal comprises blocks of data comprising words corresponding respectively to a sequence of samples, it is necessary to know the phase of the color sub-carrier of the first sample in each data block.

The eight field sequence may be identified by including identifier bits in each block of data so that on reproduction a square wave eight field identifier signal can be derived from these bits. If, however, these bits are lost or corrupted, then it may not be possible to identify the eight field sequence.

SUMMARY OF THE INVENTION

One object of the present invention is to provide apparatus for producing a corrected replica of an input square-wave signal, which input signal may include errors.

Another object of the present invention is to provide apparatus for deriving a corrected eight field identifier signal on reproduction of a digital PAL television signal from a VTR.

Another object of the present invention is to provide apparatus for detecting and correcting errors in an input signal, which input signal alternates between first and second levels.

Another object of the present invention is to provide apparatus for detecting and correcting errors in an input signal, which input signal alternates between first and second levels by counting the durations of the two levels.

According to the present invention there is provided apparatus for detecting errors in an input signal which signal alternates between first and second levels, the apparatus comprising: first and second similar counters to be supplied with said input signal so that said first counter is enabled to count when said input signal is of said first level and said second counter is enabled to count when said input signal is of said second level; a clock pulse source for supplying a clock pulse signal of high frequency relative to the frequency of said input signal to said first and second counters; means to detect errors in said input signal and thereupon to supply a signal to disable both said first and second counters; and a bistable circuit arranged to be triggered to a first stable condition by an overflow signal from said first counter and to a second stable condition by an overflow signal from said second counter, whereby said bistable circuit supplies an output signal forming a corrected replica of said input signal.

The above, and other objects, features and advantages of this invention will be apparent from the following detailed description of illustrative embodiments which is to be read in connection with the accompanying drawings.

DESCRIPTION OF THE PREFERRED EMBODIMENTS

In the particular embodiment to be described the invention is applied to field framing on reproduction of a PAL composite coded video signal from a digital VTR. As mentioned above, successive fields of the original television signal form eight field sequences due to the relationship between the color sub-carrier frequency and the horizontal line frequency, and on reproducing the composite coded video signal it is necessary to know the original eight field sequence.

Figure 1:
FIG. 1 shows a format in which data is recorded on a magnetic tape.

Referring now to FIG. 1, this shows an example of the format used in recording the data which represents the composite coded video signal, on the magnetic tape of a digital VTR. The data is made up of successive blocks of sixty-four 10-bit words. Numbering these words 1 to 64, they are allocated as follows:

| | |
|---|---|
| Words 1 and 2 | synchronizing information |
| Word 3 | line address |
| Word 4 | group identifier, eight field identifier and spare bits |
| Words 5 to 64 | video data |

The sixty video data words correspond to part of a horizontal line period. Each horizontal line of the television signal may be sampled at four hundred and eight points and each of the resulting samples is then coded to form a 10-bit word. In practice, this technique is modified in two ways. Firstly, each sample is first coded to form an 8-bit word, and each resulting 8-bit word is then converted to a 10-bit word in such a way as to reduce the dc components in the signal to be recorded on the magnetic tape by so far as reasonably possible equalizing and distributing the number of "0"s and "1"s to increase the transients and the clock frequency components. This results in a signal more suited to the recording characteristics of magnetic tape and moreover permits some measure of error detection and error correction to be applied to the reproduced video data, in addition to easier recovery of the clock frequency. Secondly, successive data words in each data word block do not necessarily correspond to successive samples along a horizontal line. Thus if the successive samples making up a horizontal line or a field are shuffled in order prior to recording and then unshuffled on reproduction, then errors such as a drop-out on reproduction from the magnetic tape will not result in loss of a continuous sequence of samples, but of individual samples distributed over a horizontal line or a field, and concealment techniques for concealing such errors are much more effective when applied to such individual samples, than when applied to continuous sequences of samples.

Figure 2:
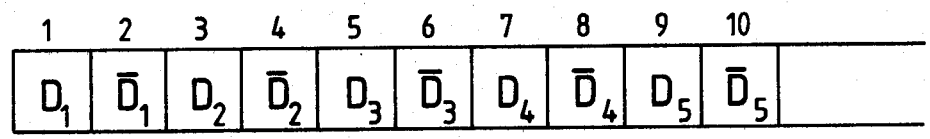
FIG. 2 shows part of the format of FIG. 1 in more detail.

Referring to FIG. 2, this shows the word 4 of a data word block in more detail. The first four bits form the group identifier, the next two bits form the eighth field identifier and the final four bits are spare. Moreover, the ten bits are always in a similar pattern, in which the second, fourth, sixth, eighth and tenth bits are always the logical inverse of the first, third, fifth, seventh and ninth bits respectively, as indicated in FIG. 2. For the purposes of the present description, only the fifth and sixth bits, which form the eight field identifier are of interest.

Figure 3:
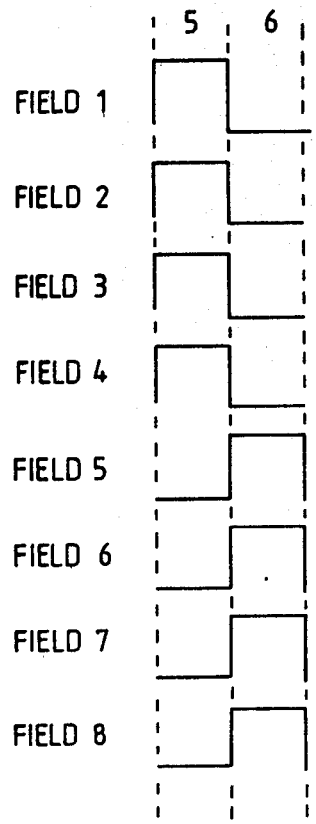
FIG. 3 shows waveforms corresponding to part of the data of FIG. 1.

FIG. 3 shows the waveforms of the eight field identifier in an eight field sequence. Thus in fields 1 to 4 the eight field identifier is "10" in fields 5 to 8 it is "01", and this will then repeat in the next sequence of eight fields. This bit arrangement ensures a balanced word structure with strong clock frequency components for recording and reproducting. As there are four data word blocks per horizontal line and 625 horizontal lines per frame, the eight field identifier occurs $$4 \times 625/2 \times 8 = 10,000$$

times per eight field sequence. Taking the first bit of each eight field identifier, five thousand of these bits will be "1"s and the remaining five thousand will be "0"s.

In general, and to reduce the number of parts of the apparatus which have to operate at very high bit rates, the words are formed and handled in parallel form until just prior to recording on the magnetic tape, but are converted to serial form for recording. On reproduction, the data is first de-serialized and the words 1 and 2 forming the synchronizing information in each data word group are identified. This enables the other sixty-two words in the data word group to be identified, and in particular enables the word 4 including the eight field identifier to be identified and gated out. Nevertheless, there may be errors. Thus, the eight field identifier may itself contain an error bit, or the eight field identifier may not be gated out correctly.

Figure 4:
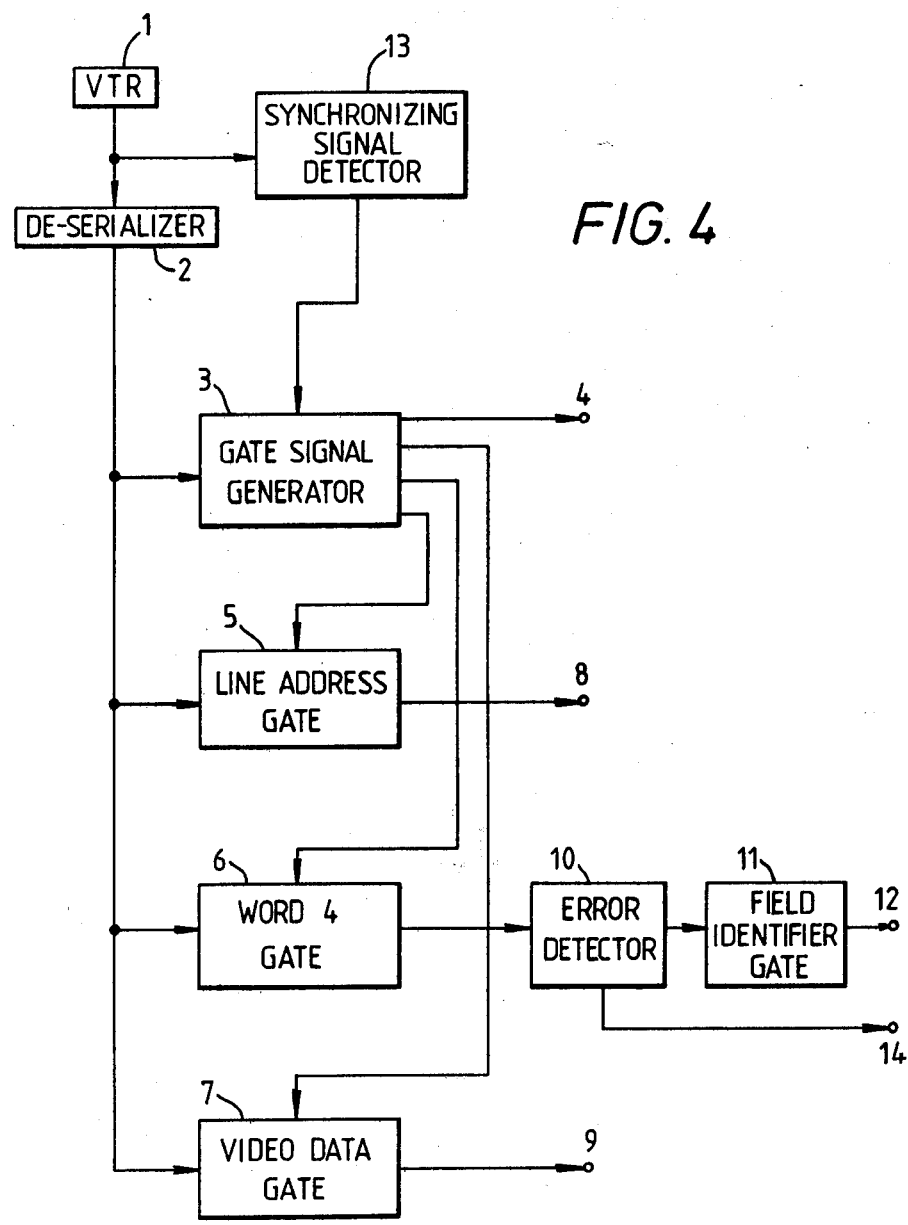
FIG. 4 shows in block form part of a video signal reproducing system.

FIG. 4, to which reference is now made, shows the relevant parts of a reproduction system, A VTR 1 is connected via a data de-serializer 2 to a gate signal generator 3 having an output terminal 4. The output of the de-serializer 2 is also connected to a line address gate 5, a word 4 gate 6 and a video data gate 7, and the gate signal generator 3 supplies respective gating signals to the gates 5 to 7. The outputs of the gates 5 and 7 are connected to output terminals 8 and 9 respectively, and the output of the word 4 gate 6 is connected via a word error detector 10 and an eight field identifier gate 11 to an output terminal 12. The VTR 1 is also connected to a synchronizing signal detector 13, an output of which is connected to the gate signal generator 3.

The operation of this part of the reproduction system will now be described. The VTR 1 supplies a reproduced data signal in serial form to the data de-serializer 2 which converts the signal to parallel form and supplies it to the gate signal generator 3 which develops respective gating signals in dependence on the synchronizing information for supply to the gates 5 to 7. The line address gate 5 gates out the word 3 forming the line address for supply to the output terminal 8. The video data gate 7 gates out the data words 5 to 64 for supply to the output terminal 9. The word 4 gate 6 gates out the word 4 and supplies it to the error detector 10.

Although the word 4 is a 10-bit word it can in fact only assume $2^5$, that is 32, different values, due to the bit pattern described with reference to FIG. 2. The error detector 10 therefore operates to check whether the word supplied by the word 4 gate 6 has one of the 32 possible values and if not supplies an error signal to an output terminal 14. It is, however, possible for an error to be present which the error detector 10 does not recognize as such.

The word 4 is then supplied to the field identifier gate 11 which operates to gate out the fifth and sixth bits which form the eight field indentifier and to supply the resulting sequence of eight field identifiers as shown in FIG. 3 to the output terminal 12.

Figure 5:
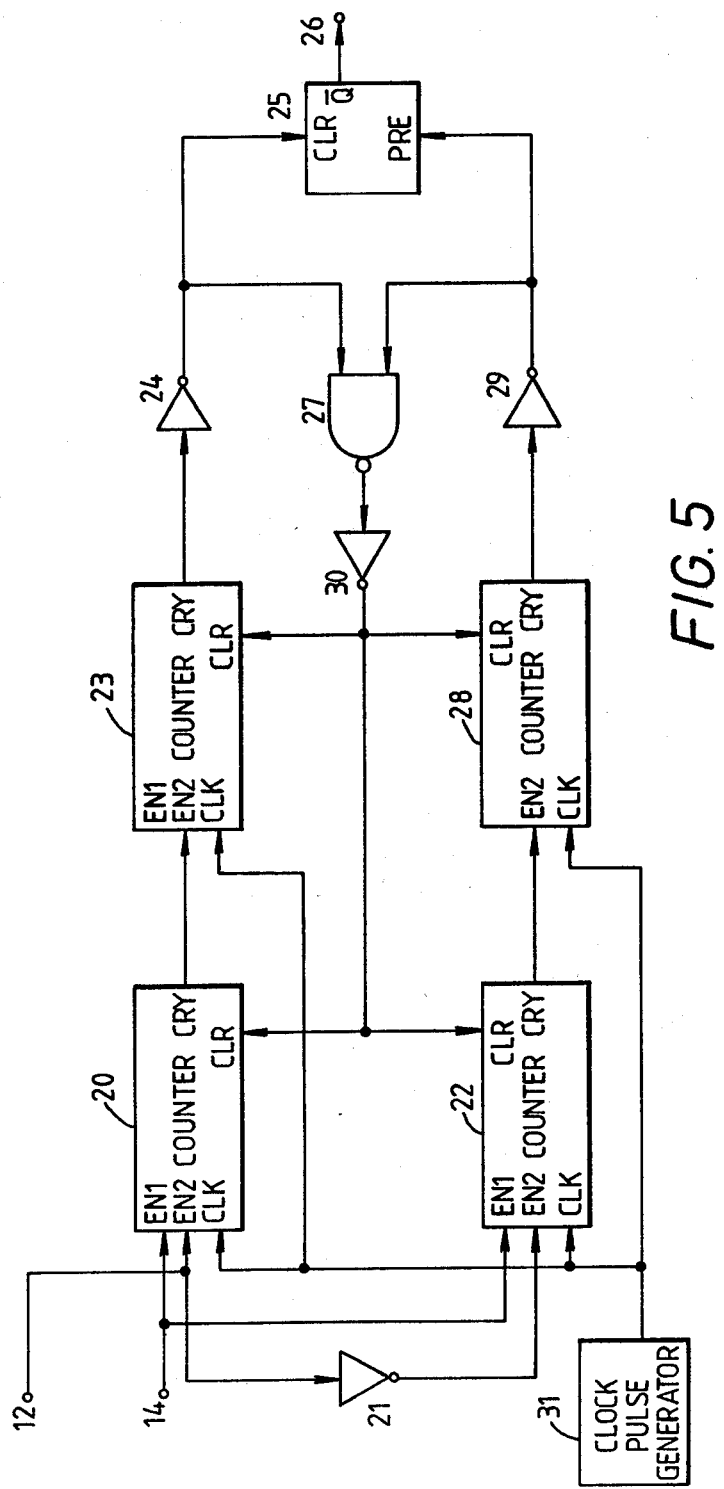
FIG. 5 shows in block form an embodiment of the invention.

FIG. 5, to which reference is now made, shows a circuit arrangement for producing a correct eight field identifier even in the presence of errors not detected by the error detector 10 of FIG. 4.

The circuit arrangement comprises the output terminal 12 of FIG. 4 which is connected directly to a second enable terminal of a decade counter 20 and by way of an inverter 21 to a second enable terminal of a decade counter 22. The output terminal 14 of FIG. 4 is connected directly to respective first enable terminals of the counters 20 and 22. The counter 20 has a carry output terminal connected to an enable terminal of a decade counter 23, a carry output terminal of which is connected via an inverter 24 to a clear terminal of a bistable circuit 25 having an output connected to an output terminal 26, and to one input terminal of a NOR gate 27. The counter 22 has a carry terminal connected to an enable terminal of a decade counter 28, a carry output terminal of which is connected via an inverter 29 to a pre-set terminal of the bistable circuit 25, and to the other input terminal of the NOR gate 27. The output of the NOR gate 27 is connected via an inverter 30 to respective clear terminals of the counters 20, 22, 23 and 28. A clock pulse generator 31 supplies a clock pulse signal having a frequency equal to the horizontal line frequency to respective clock terminals of the counters 20, 22, 23 and 28.

The operation will now be described. Assume first that correct eight field identifiers as shown in FIG. 3 are being supplied to the terminal 12. The arrangement is such that during the fields 1 to 4 the eight field identifier results in a "1" at the terminal 12, because the digit 5 is the dominant one and the digit 6 is merely the logical inverse of the digit 5, and during the fields 5 to 8 the eight field identifier results in a "0" at the terminal 12.

During the fields 1 to 4, therefore, the counter 20 is enabled by a signal at the second enable terminal, and counts the clock pulses. On reaching a count of ten the counter 20 supplies a carry signal to the counter 23 which then counts one clock pulse. The "1" at the terminal 12 does not result in the counter 22 being enabled, due to the action of the inverter 21.

When the counter 23 reaches a count of ten it supplies a carry signal to the inverter 24 which supplies signals to clear the bistable circuit 25 and to cause the NOR gate 27 to supply a signal via the inverter 30 to clear the counters 20, 22, 23 and 28. So long as the "1" remains at the terminal 12 therefore pulses will be supplied to the clear terminal of the bistable circuit 25 at intervals, each time there is a total count of one hundred, that is when the counter 23 reaches a count of ten, and the output of the bistable circuit 25, which is supplied to the output terminal 26 remains "1".

During the fields 5 to 8, when a "0" is supplied to the terminal 12 the counter 20 is not enabled, but the counter 22 is enabled and the counter 28 will supply pulses at intervals to the pre-set terminal of the bistable circuit 25 and to cause the counters 20, 21, 23 and 28 to be cleared. During this time, therefore, the output of the bistable circuit 25, which is supplied to the output terminal 26 is "0". Thus the signal developed at the output terminal 26 is a slightly delayed replica of the signal representing the eight field identifiers, that is it is a square wave signal of period eight fields.

In the event that the error detector 10 (FIG. 4) supplies an error signal to the terminal 14, this error signal will disable both the counter 20 and the counter 22. So long as this error signal persists, therefore, neither of the counters 20 and 22 will count. If during a period when correctly the counters 20 and 23 should be counting, that is, if no error signal is present at terminal 14, and assuming that every tenth eight field identifier is in error, and the errors are such that the counter 22 is enabled, then by the time the counter 23 supplies a carry signal the counter 22 will only have reached a count of ten for the first time and will then be cleared due to the carry signal from the counter 23. No signal will therefore be supplied to the pre-set terminal of the bistable circuit 25 until the reversal from "1" to "0" of the eight field identifier. A similar operation will occur when the counters 22 and 28 should be counting in the absence of an error signal at terminal 14.

It will thus be seen that errors produce a small count in the otherwise inactive counter 20 or 22, and possibly in the counter 23 or 28, which small count is cleared before any erroneous pulse is supplied to the bistable circuit 25. The result of the errors is to produce a small additional delay in the next pulse of the square wave signal at the output terminal 26 following the errors, but this timing instability can readily be removed by latching the square wave signal with a pulse signal at the field frequency.

The counters 20 and 23 can be replaced by a single counter counting to one hundred, and the counters 22 and 28 can likewise be replaced by a single counter counting to one hundred. Moreover, in the embodiment described only the dominant digit 5 is used at the terminal 12, but if the digits 5 and 6 are used for enabling the counters 20 and 22 respectively, then the inverter 21 need not be included.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for correcting errors in a square-wave input signal which alternates between first and second levels in periodic sequences, comprising:
   first and second counter means supplied with said input signal and connected so that said first counter means is enabled to count when said input signal is of said first level and said second counter means is enabled to count when said input signal is of said second level;
   a clock pulse source for supplying to said first and second counter means a clock pulse signal of high frequency relative to the frequency of said input signal;
   error detector means connected to said input signal for detecting errors therein and supplying an error signal to disable both said first and second counter means; and
   a bistable circuit arranged to be triggered to a first stable condition by an overflow signal from said first counter means and to a second stable condition by an overflow signal from said second counter means, whereby said bistable circuit supplies an output signal forming a corrected replica of said input signal.

2. Apparatus according to claim 1 wherein said overflow signals from said first and second counter means are fed to logic means connected to both said first and second counter means for clearing the counts then accumulated in said first and second counter means.

3. Apparatus according to claim 1 wherein each of said first and second counter means comprises two decade counters connected in series.

4. Apparatus according to claim 1 wherein said input signal is arranged to be supplied directly to said first counter means and is also fed to an inverter having an output connected to an input of said second counter means.

5. Apparatus according to claim 1 wherein said input signal is a framing signal derived from a television signal.

6. Apparatus according to claim 5 wherein said television signal is a digital television signal.

7. Apparatus according to claim 5 wherein said framing signal is a eight field identifier derived from a PAL color television signal.

8. Apparatus for providing correct field framing in a composite coded digital video signal reproduced by a video tape recorder, comprising:
   means for separating repetitively occurring field-identifier digital words from said composite coded digital video signal;
   error detection means connected to receive said field-identifier words for producing an error signal upon detecting an error therein;
   first and second counter means connected to receive said field-identifier words and said error signal for counting in said first counter means when said field-identifier words have a first value and for counting in said second counter means when said field-identifier words have a second value, both said first and second counter means being disabled upon receiving said error signal; and
   output means connected to said first and second counter means for forming an output signal when said first counter means reaches a preselected count and for changing the level of said output signal when said second counter means reaches said preselected count, said output signal thereby forming a corrected replica of said field-identifier words.

9. Apparatus according to claim 8, further comprising counter clear means connected to clear a count in said first and second counter means upon either said first or second counter means reaching said preselected count.

10. Apparatus according to claim 9, in which said counter clear means comprises a NOR gate.

11. Apparatus according to claim 8, further comprising a clock pulse generator for producing a clock signal fed to said first and second counter means and having a frequency substantially higher than the frequency at which said field-identifier words occur in said composite coded digital video signal.

12. Apparatus according to claim 8, in which said output means comprises a bistable circuit.

13. Apparatus according to claim 8, in which each of said first and second counter means comprises two decade counters connected in series.

14. Apparatus according to claim 8, wherein said corrected replica of said video signal is an eight-field identifier signal derived from a PAL color televisioin signal.

* * * * *